(12) United States Patent
Wang et al.

(10) Patent No.: US 11,315,962 B2
(45) Date of Patent: Apr. 26, 2022

(54) PRE-STRETCHED SUBSTRATE AND METHOD FOR MANUFACTURING THE SAME, ELECTRONIC DEVICE AND METHOD FOR MANUFACTURING THE SAME

(71) Applicant: BOE TECHNOLOGY GROUP CO., LTD., Beijing (CN)

(72) Inventors: Pinfan Wang, Beijing (CN); Mingche Hsieh, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 16 days.

(21) Appl. No.: 16/617,854

(22) PCT Filed: Apr. 25, 2019

(86) PCT No.: PCT/CN2019/084225
§ 371 (c)(1),
(2) Date: Nov. 27, 2019

(87) PCT Pub. No.: WO2019/206216
PCT Pub. Date: Oct. 31, 2019

(65) Prior Publication Data
US 2020/0168641 A1    May 28, 2020

(30) Foreign Application Priority Data
Apr. 25, 2018 (CN) .......................... 201810379393.X

(51) Int. Cl.
*H01L 27/12* (2006.01)
(52) U.S. Cl.
CPC ...... *H01L 27/1266* (2013.01); *H01L 27/1218* (2013.01)

(58) Field of Classification Search
CPC .................. H01L 27/1266; H01L 27/1218
See application file for complete search history.

(56) References Cited

U.S. PATENT DOCUMENTS 7,491,892 B2   2/2009 Wagner et al.
8,905,772 B2   12/2014 Rogers et al.
(Continued)

FOREIGN PATENT DOCUMENTS

CN   101470278 A   7/2009
CN   102244015 A   11/2011
(Continued)

OTHER PUBLICATIONS

International Search Report of PCT/CN2019/084225 and translation, dated Jul. 29, 2019, 16 pages.
Office Action of CN Application No. 201810379393X and translation, dated Jul. 3, 2019, 24 pages.

*Primary Examiner* — Christine A Enad
(74) *Attorney, Agent, or Firm* — Muncy, Geissler, Olds & Lowe, P.C.

(57) ABSTRACT

The present disclosure discloses a pre-stretched substrate, a method for manufacturing the same, an electronic device and a method for manufacturing the same. The method for manufacturing a pre-stretched substrate includes: sequentially forming at least two film layers on a carrier plate at a temperature higher than a first temperature threshold; wherein thermal expansion coefficients of the at least two film layers are different; and separating the at least two film layers from the carrier plate, thereby obtaining the pre-stretched substrate. The at least two film layers have different degrees of contraction in a normal temperature environment.

16 Claims, 2 Drawing Sheets

(56) References Cited

U.S. PATENT DOCUMENTS

| | | | |
|---|---|---|---|
| 9,105,555 B2 | 8/2015 | Rogers et al. | |
| 2009/0167638 A1 | 7/2009 | Lee et al. | |
| 2010/0002402 A1 | 1/2010 | Rogers et al. | |
| 2010/0178722 A1* | 7/2010 | de Graff | H01L 27/14687 438/65 |
| 2013/0170033 A1* | 7/2013 | Park | G02B 5/3025 359/483.01 |
| 2013/0316487 A1* | 11/2013 | de Graff | H01L 27/14687 438/66 |
| 2016/0372689 A1 | 12/2016 | Hao et al. | |
| 2019/0148653 A1 | 5/2019 | Chen et al. | |
| 2020/0142102 A1* | 5/2020 | Kikuchi | C09D 183/06 |

FOREIGN PATENT DOCUMENTS

| | | |
|---|---|---|
| CN | 103872002 A | 6/2014 |
| CN | 104568556 A | 4/2015 |
| CN | 106094300 A | 11/2016 |
| CN | 106222619 A | 12/2016 |
| CN | 106229419 A | 12/2016 |
| CN | 107204343 A | 9/2017 |
| CN | 107369385 A | 11/2017 |
| CN | 107564415 A | 1/2018 |
| CN | 107706156 A | 2/2018 |
| CN | 108597376 A | 9/2018 |
| JP | 2008068406 A | 3/2008 |
| KR | 20160036154 | 4/2016 |
| TW | 2016-35871 A | 10/2016 |

* cited by examiner

PRE-STRETCHED SUBSTRATE AND METHOD FOR MANUFACTURING THE SAME, ELECTRONIC DEVICE AND METHOD FOR MANUFACTURING THE SAME

CROSS-REFERENCE TO RELATED APPLICATION

This application claims the benefit and priority of Chinese Application No. 201810379393.X, filed on Apr. 25, 2018, which is incorporated herein by reference in its entirety.

TECHNICAL FIELD

The present disclosure relates to the technical field of pre-stretched substrates, and in particular to a pre-stretched substrate, a method for manufacturing the same, an electronic device and a method for manufacturing the same.

BACKGROUND

A flexible display device is a bendable display device which is made of a flexible material and is capable of changing in shapes. The flexible display devices are widely used in various fields due to their advantages such as low power consumption, diversity of displaying modes, small in size and light weight.

In order to ensure good bending performance of the flexible display, when manufacturing the flexible display device in the related art, a flexible substrate is generally made of a flexible material with good deformability, and then other functional layers are formed on the flexible substrate, so that the manufactured flexible display device can withstand large bending, stretching or torsional deformation.

SUMMARY

A first aspect of the present disclosure provides a method of manufacturing a pre-stretched substrate, including:

sequentially forming at least two film layers on a carrier plate at a temperature higher than a first temperature threshold; wherein thermal expansion coefficients of the at least two film layers are different; and separating the at least two film layers from the carrier plate, thereby obtaining the pre-stretched substrate; wherein the at least two film layers have different degrees of contraction in a normal temperature environment.

Optionally, the first temperature threshold is between 100° C. and 300° C.

Optionally, in the at least two film layers, the thermal expansion coefficient of one film layer adjacent to the carrier plate is greater than the thermal expansion coefficient of one film layer far from the carrier plate.

Optionally, the sequentially forming at least two film layers on a carrier plate, includes: forming a first film layer on the carrier plate, and forming a second film layer on a surface of the first film layer distal to the carrier plate. The separating the at least two film layers from the carrier plate, thereby obtaining the pre-stretched substrate, includes: separating the first film layer from the carrier plate with the pre-stretched substrate including the first film layer and the second film layer on the first film layer.

Optionally, after separating the at least two film layers from the carrier plate, the method further includes: forming a third film layer on a surface of the first film layer distal to the second film layer at a temperature higher than a second temperature threshold; wherein a thermal expansion coefficient of the third film layer is different from the thermal expansion coefficient of the first film layer.

Optionally, the first film layer includes a flexible substrate; the second film layer includes a stress layer; and the third film layer includes a stress adjustment layer.

Optionally, the forming a first film layer on the carrier plate, includes: forming the flexible substrate formed on the carrier plate by using an organic material; wherein a thermal expansion coefficient of the carrier plate is the same as or similar to a thermal expansion coefficient of the organic material; or, providing a flexible film layer, attaching the flexible film layer to the carrier plate, and enabling the flexible film layer to thermally expand at the temperature higher than the first temperature threshold, thereby forming the flexible substrate.

Optionally, the organic material is one of polyimide, silicone material, polymethyl methacrylate, polycarbonate, acrylonitrile-butadiene-styrene copolymer, polyethylene, and polystyrene.

Optionally, the forming a second film layer on a surface of the first film layer distal to the carrier plate, includes: depositing an inorganic material on the flexible substrate to form an entire layer of the stress layer; or, providing an inorganic thin film layer, attaching the inorganic thin film layer to the flexible substrate, and enabling the inorganic thin film layer to thermally expand at the temperature higher than the first temperature threshold, thereby forming an entire layer of stress layer.

Optionally, the inorganic material is SiN, SiO and metal.

Optionally, after forming an entire layer of stress layer, the method further includes: patterning the entire layer of the stress layer to form a plurality of separate stress layer graphics.

Optionally, the forming a second film layer on a surface of the first film layer distal to the carrier plate, includes: forming the stress adjustment layer on the surface of the flexible substrate distal to the stress layer by using a metal material; or, providing an inorganic metal thin film layer, attaching the inorganic metal thin film layer to the surface of the flexible substrate distal to the stress layer, and enabling the inorganic metal thin film layer to thermally expand at the temperature higher than the second temperature threshold, thereby forming the stress adjustment layer.

Optionally, the thermal expansion coefficient of the flexible substrate is between 10 ppm/° C. and 50000 ppm/° C.; and the thermal expansion coefficient of the stress layer is between 10 ppm/° C. and 1000 ppm/° C.

Optionally, the thermal expansion coefficient of the flexible substrate is between 3 ppm/° C. and 250 ppm/° C.; the thermal expansion coefficient of the stress layer is between 3 ppm/° C. and 100 ppm/° C.; and the thermal expansion coefficient of the stress adjustment layer is between 3 ppm/° C. to 100 ppm/° C.

A second aspect of the present disclosure provides a method for manufacturing an electronic device, including:

sequentially forming at least two film layers on a carrier plate at a temperature higher than a first temperature threshold; wherein thermal expansion coefficients of the at least two film layers are different, and the at least two film layers have different degrees of contraction in a normal temperature environment;

forming a driving circuit on one of the at least two film layers, which is farthest from the carrier plate; and separating one of the at least two film layers, which is in contact with the carrier plate, from the carrier plate to obtain a pre-stretched electronic device;

wherein the pre-stretched electronic device includes the at least two film layers, and the driving circuit on one of the at least two film layers, which is farthest from the carrier plate.

Optionally, the sequentially forming at least two film layers on a carrier plate, includes: forming a first film layer on the carrier plate, and forming a second film layer on a surface of the first film layer distal to the carrier plate. The forming a driving circuit on one of the at least two film layers, which is farthest from the carrier plate, includes: forming the driving circuit on the second film layer. The separating one of the at least two film layers, which is in contact with the carrier plate, from the carrier plate to obtain a pre-stretched electronic device, includes: separating the first film layer from the carrier plate with the pre-stretched electronic device including the first film layer, the second film layer on the first film layer, and the driving circuit on the second film layer.

Optionally, after separating the first film layer from the carrier plate, the method further includes: forming a third film layer on a surface of the first film layer distal to the second film layer at a temperature higher than a second temperature threshold; wherein a thermal expansion coefficient of the third film layer is different from the thermal expansion coefficient of the first film layer.

Optionally, the first film layer includes a flexible substrate; the second film layer includes a stress layer; and the third film layer includes a stress adjustment layer.

Optionally, the stress layer is formed on the flexible substrate in a way including: forming an entire layer of the stress layer on the flexible substrate; or, forming a plurality of separate stress layer graphics on the flexible substrate.

Optionally, the forming a driving circuit on one of the at least two film layers, which is farthest from the carrier plate, includes: attaching the driving circuit to the at least two film layers. The driving circuit includes a second flexible substrate layer attaching to the pre-stretched substrate, components for realizing driving functions and a wiring layer; the second flexible substrate layer includes thinner soft portions and thicker rigid portions; the components are on the thicker rigid portions and the components are connected by the wiring layer.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure, and do not constitute an improper limitation to the present disclosure.

DETAILED DESCRIPTION

Figure 1:
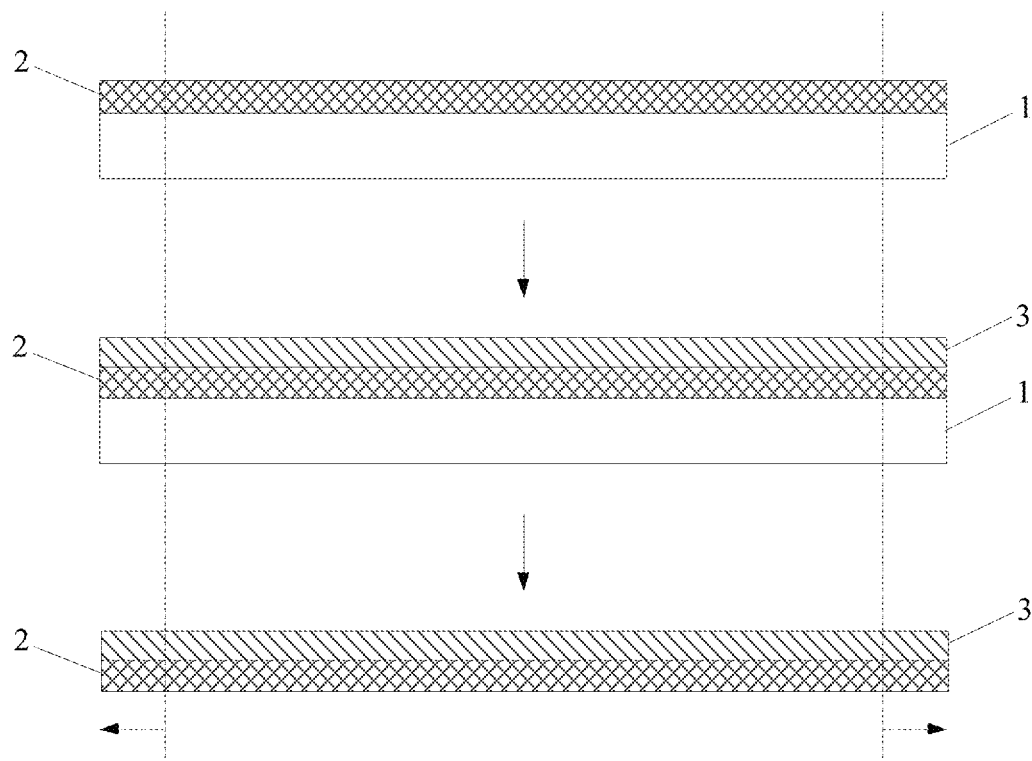
FIG. 1 is a flowchart of a method for manufacturing a pre-stretched substrate according to an embodiment of the present disclosure.

In order to further explain a pre-stretched substrate, a method for manufacturing the same, an electronic device and a method for manufacturing the same provided by the embodiments of the present disclosure, description will be described in details hereinafter in conjunction with the accompanying drawings.

In order to further enhance the ability of flexible display devices to withstand stress, more and more manufacturers are now using pre-stretched flexible substrates to manufacture the flexible display devices. In this way, when the manufactured flexible display devices is stretched with a large force, the pre-stretched substrate can release the stress, thereby preventing other functional layers in the flexible display from being damaged by the large stress and then ensuring usability of the flexible display device.

In the related art, when manufacturing a pre-stretched flexible substrate, generally, a flexible film is first formed by using an organic material, and then an outward pulling force is applied to a periphery of the flexible film to pre-stretch the flexible film in a manner similar to spreading a net, thereby forming a pre-stretched substrate. However, such a method for manufacturing a pre-stretched substrate cannot form a pre-stretched substrate with a large area and a uniform pre-stretching amount. Thus, the display device manufactured using the pre-stretched substrate has a poor stretching performance.

In view of this, embodiments of the present disclosure provide a pre-stretched substrate, a method for manufacturing the same, an electronic device and a method for manufacturing the same, which can solve the problems that the method for manufacturing pre-stretched substrates in the related art cannot form a pre-stretched substrate with a large area and a uniform pre-stretching amount.

One embodiment of the present disclosure provides a method for manufacturing a pre-stretched substrate including the following steps.

S11: sequentially forming at least two film layers on a carrier plate at a temperature higher than a preset temperature, where thermal expansion coefficients of the at least two film layers are different.

Specifically, the above preset temperature (which may also be referred as a first temperature threshold) may be a normal temperature, for example, 25° C. The temperature higher than the preset temperature may be set according to the thermal expansion coefficients of at least two film layers actually formed. For example, the temperature higher than the preset temperature may be set between 100° C. and 300° C. The at least two film layers formed at the temperature higher than the preset temperature can be uniformly extended. Besides, since the thermal expansion coefficients of the at least two film layers are different, the at least two film layers formed in the same temperature higher than the preset temperature have different expansion degrees. It should be noted that at least two film layers sequentially formed on the carrier plate are laminated.

S12: separating the at least two film layers from the carrier plate to obtain a pre-stretched substrate.

Specifically, after the at least two film layers are manufactured at the temperature higher than the preset temperature, the at least two film layers may be separated from the carrier plate, that is, the film layer in contact with the carrier plate is separated from the carrier plate, thereby obtaining a pre-stretched substrate which is composed of the at least two film layers. In the pre-stretched substrate, the at least two film layers have different thermal expansion coefficients, therefore, when the pre-stretched substrate is placed in a normal temperature environment, the at least two film layers have different degrees of contraction. Then, stress is generated between film layers of the at least two film layers, thereby enabling the pre-stretched substrate to have pre-stretching properties.

According to the specific process for manufacturing the pre-stretched substrate, according to the method for manufacturing pre-stretched substrates provided in the embodiment of the present disclosure, at least two film layers of different thermal expansion coefficients are sequentially formed on the carrier plate at the temperature higher than the preset temperature. In the process of forming each film layer, each film layer can undergo uniform thermal expansion. Then, the formed at least two film layers are separated from the carrier plate to form the pre-stretched substrate which is composed of the at least two film layers. Since the thermal expansion coefficients of the at least two film layers are different, the film layers at the temperature higher than the preset temperature have different expansion degrees. Then, when the manufactured pre-stretched substrate is applied in a normal temperature environment, the film layers have different degrees of contraction. And then, stress is generated between film layers, thereby forming the pre-stretched substrate. It can be seen that when manufacturing the pre-stretched substrate according to the method provided in one embodiment of the present disclosure, the at least two film layers included in the pre-stretched substrate are uniformly thermally expanded at the temperature higher than the preset temperature, thereby ensuring uniformity of a pre-stretching amount of the pre-stretched substrate. Further, the size of the manufactured pre-stretched substrate is not limited, and a large-area pre-stretched substrate can be manufactured.

In addition, since the pre-stretched substrate manufactured according to the method of the embodiment of the present disclosure includes at least two film layers, the prepared pre-stretched substrate has better resistance to water and oxygen. When the display device is manufactured with the pre-stretched substrate, the prepared display device has better sealing performance, thereby effectively extending the service life of the display device. In addition, the method for manufacturing the pre-stretched substrate provided in the embodiment of the present disclosure can be used for mass production of pre-stretched substrates.

Further, the step of sequentially forming at least two film layers on the carrier plate specifically includes: forming a first film layer on the carrier plate, and forming a second film layer on a surface of the first film layer distal to the carrier plate.

The step of separating the at least two film layers from the carrier plate to obtain the pre-stretched substrate includes: separating the first film layer from the carrier plate with the pre-stretched substrate including the first film layer and the second film layer on the first film layer.

Specifically, when manufacturing the first film layer and the second film layer at the temperature higher than the preset temperature, the temperature higher than the preset temperature may be set according to thermal expansion coefficients of the first film layer and the second film layer to be actually manufactured. After fabrication of the first film layer and the second film layer is completed at the temperature higher than the preset temperature, the first film layer may be separated from the carrier plate, thereby obtaining the pre-stretched substrate which is composed of the first film layer and the second film layer on the first film layer. In the pre-stretched substrate, since the thermal expansion coefficient of the first film layer is different from the thermal expansion coefficient of the second film layer, when the pre-stretched substrate is placed in a normal temperature environment, the first film layer and the second film layer have different degrees of contraction. Then, stress is generated between the first film layer and the second film layer, thereby enabling the pre-stretched substrate to have pre-stretching properties.

Moreover, after the first film layer is separated from the carrier plate, the method for manufacturing the pre-stretched substrate provided by the above embodiment further includes: forming a third film layer on a surface of the first film layer distal to the second film layer at a temperature higher than a preset temperature, where a thermal expansion coefficient of the third film layer is different from the thermal expansion coefficient of the first film layer.

Specifically, after fabrication of the pre-stretched substrate including the first film layer and the second film layer, the presence of the third film layer, which is formed on the surface of the first film layer distal to the second film layer and has a thermal expansion coefficient different from that of the first film layer, can further adjust the pre-stretching amount of the pre-stretched substrate.

It should be noted that the prepared pre-stretched substrate is not limited to including the first film layer, the second film layer and the third film layer, and may further include more film layers. That is, according to actual needs, multiple film layers having different thermal expansion coefficients may be provided to adjust the pre-stretching amount of the prepared pre-stretched substrate.

The first film layer, the second film layer, and the third film layer are various in kind. For example, the first film layer includes a flexible substrate, the second film layer includes a stress layer, and the third film layer includes a stress adjustment layer. Hereinafter, the manufacturing process of the pre-stretched substrate is described in detail hereinafter with an example, in which the first film layer is a flexible substrate, the second film layer is a stress layer and the third film layer is a stress adjustment layer.

Figure 2:
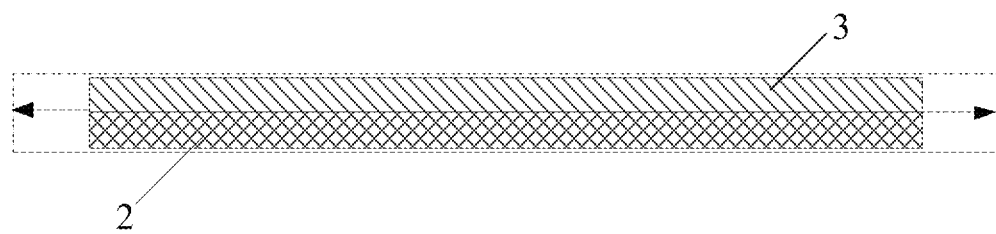
FIG. 2 is a first schematic structural view of a pre-stretched substrate according to an embodiment of the present disclosure.

Referring to FIG. 1 and FIG. 2, the step of sequentially forming at least two film layers on a carrier plate 1, includes: forming a flexible substrate 2 on the carrier plate 1, and forming a stress layer 3 on a surface of the flexible substrate 2 distal to the carrier plate 1.

Specifically, the temperature higher than the preset temperature may be set according to the thermal expansion coefficient of the flexible substrate 2 and the thermal expansion coefficient of the stress layer 3 to be actually manufactured. The flexible substrate 2 and the stress layer 3 formed at the temperature higher than the preset temperature can be uniformly extended. Further, the thermal expansion coefficient of the stress layer 3 is different from the thermal expansion coefficient of the flexible substrate 2, thus, the stress layer 3 and the flexible substrate 2 formed at the same temperature higher than the preset temperature have different expansion degrees.

The step of separating the at least two film layers from the carrier plate 1 to obtain a pre-stretched substrate, includes: separating the flexible substrate 2 from the carrier plate 1 with the pre-stretched substrate including the flexible substrate 2 and the stress layer 3 on the flexible substrate 2.

Specifically, after the fabrication of the flexible substrate 2 and the stress layer 3 is completed at the temperature higher than the preset temperature, the flexible substrate 2 can be separated from the carrier plate 1, thereby obtaining the pre-stretched substrate which is composed of the flexible substrate 2 and the stress layer 3 on the flexible substrate 2. In the pre-stretched substrate, since the thermal expansion coefficient of the flexible substrate 2 is different from the thermal expansion coefficient of the stress layer 3, when the pre-stretched substrate is placed in a normal temperature environment, the flexible substrate 2 and the stress layer 3 have different degrees of contraction. Then, stress is generated between the flexible substrate 2 and the stress layer 3, thereby enabling the pre-stretched substrate to have pre-stretching properties. More specifically, in an example in which the thermal expansion coefficient of the stress layer 3 is less than the thermal expansion coefficient of the flexible substrate 2, since the thermal expansion coefficient of the stress layer 3 is less than the thermal expansion coefficient of the flexible substrate 2, the degree of thermal expansion of the stress layer 3 is less than the degree of thermal expansion of the flexible substrate 2 when manufacturing the flexible substrate 2 and the stress layer 3 at the temperature higher than the preset temperature. Correspondingly, when the prepared flexible substrate 2 and the stress layer 3 are placed in a normal temperature environment, the degree of contraction of the stress layer 3 is less than the degree of contraction of the flexible substrate 2. Then, stress is generated between the flexible substrate 2 and the stress layer 3, thereby enabling the pre-stretched substrate to have pre-stretching properties.

It should be noted that a length between two dotted lines without arrows in FIG. 1 is a length of the pre-stretched substrate in a normal temperature environment. Two dotted lines with arrows in FIG. 1 indicate a pre-stretched direction of the pre-stretched substrate. Solid lines with arrows in FIG. 1 represent the manufacturing process of the pre-stretched substrate. The length of the flexible substrate 2 and the stress layer 3 shown in FIG. 1 is a length of the flexible substrate 2 and the stress layer 3 after thermal expansion at the temperature higher than the preset temperature. The dotted line frame in FIG. 2 represents the length of the flexible substrate 2 and the stress layer 3 after thermal expansion at the temperature higher than the preset temperature. Two dotted lines with arrows in FIG. 2 indicate a pre-stretched direction of the pre-stretched substrate. A length of the flexible substrate 2 and the stress layer 3 shown in FIG. 2, is a length of the flexible substrate 2 and the stress layer 3 which are contracted in the normal temperature environment.

According to the method for manufacturing pre-stretched substrates provided in the embodiment of the present disclosure, the flexible substrate 2 is first formed on the carrier plate 1 at the temperature higher than the preset temperature, so that the flexible substrate 2 can undergo uniform thermal expansion. Then, the stress layer 3 is formed on the flexible substrate 2. The thermal expansion coefficient of the formed stress layer 3 is different from that of the flexible substrate 2. And then, the flexible substrate 2 is separated from the carrier plate 1, thereby forming the pre-stretched substrate which is composed of the flexible substrate 2 and the stress layer 3. Since the thermal expansion coefficients of the flexible substrate 2 and the stress layer 3 are different, they have different expansion degrees at the temperature higher than the preset temperature. Then, when the manufactured pre-stretched substrate is applied in a normal temperature environment, the flexible substrate 2 and the stress layer 3 have different degrees of contraction. And then, stress is generated between the flexible substrate 2 and the stress layer 3, thereby forming the pre-stretched substrate. It can be seen that when manufacturing the pre-stretched substrate according to the method provided in one embodiment of the present disclosure, the flexible substrate 2 and the stress layer 3 included in the pre-stretched substrate are uniformly thermally expanded at the temperature higher than the preset temperature, thereby ensuring uniformity of a pre-stretching amount of the pre-stretched substrate. Further, the size of the manufactured pre-stretched substrate is not limited, and a large-area pre-stretched substrate can be manufactured. In addition, since the pre-stretched substrate manufactured according to the method of the embodiment of the present disclosure includes the flexible substrate 2 and the stress layer 3, the prepared pre-stretched substrate has better resistance to water and oxygen.

Figure 3:
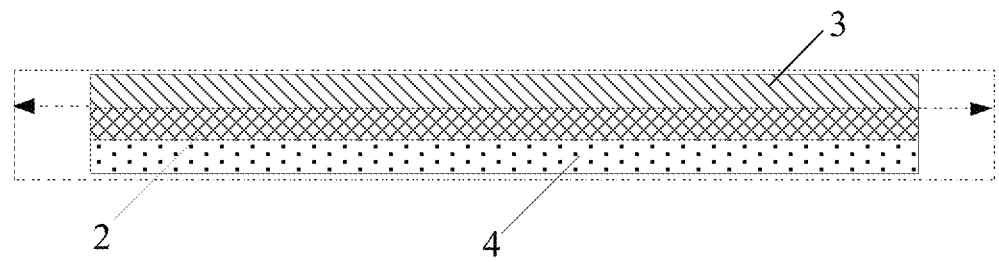
FIG. 3 is a second schematic structural view of a pre-stretched substrate according to an embodiment of the present disclosure.

Further, after the flexible substrate 2 is separated from the carrier plate 1, the method for manufacturing the pre-stretched substrate provided by the above embodiment further includes:

as shown in FIG. 3, forming a stress adjustment layer 4 on a surface of the flexible substrate 2 distal to the stress layer 3 at a temperature higher than a preset temperature (which may also be referred to as a second temperature threshold). The thermal expansion coefficient of the stress adjustment layer 4 is different from the thermal expansion coefficient of the flexible substrate 2.

Specifically, after fabrication of the pre-stretched substrate including the flexible substrate 2 and the stress layer 3, the presence of the stress adjustment layer 4, which is formed on the surface of the flexible substrate 2 distal to the stress layer 3 and has a thermal expansion coefficient different from that of the flexible substrate 2, can further adjust the pre-stretching amount of the pre-stretched substrate. More specifically, taking the stress adjustment layer 4 having a thermal expansion coefficient greater than that of the flexible substrate 2 as an example, when the formed pre-stretched substrate including the flexible substrate 2 and the stress layer 3 is excessively stretched and cannot meet actual requirements, the stress adjustment layer 4 having a thermal expansion coefficient greater than the thermal expansion coefficient of the flexible substrate 2 may be formed on the surface of the flexible substrate 2 distal to the stress layer 3. In this way, at the temperature higher than the preset temperature, the degree of expansion of the stress adjustment layer 4 is greater than the degree of expansion of the flexible substrate 2. Correspondingly, when the pre-stretched substrate including the flexible substrate 2, the stress layer 3 and the stress adjustment layer 4 is applied in the normal temperature environment, the degree of contraction of the stress adjustment layer 4 is greater than the degree of contraction of the flexible substrate 2. Then, the stress adjustment layer 4 can change the stress between the flexible substrate 2 and the stress layer 3, thereby achieving adjustment of the pre-stretching amount of the pre-stretched substrate.

In some embodiments, the first temperature threshold and the second temperature threshold may be the same or different, and values of the two may be between 100° C. and 300° C.

Further, there are various methods of forming the flexible substrate 2 on the carrier plate 1, and two specific methods for forming the flexible substrate are exemplified hereinafter.

In the first method, the flexible substrate 2 is formed on the carrier plate 1 by using an organic material. The thermal expansion coefficient of the carrier plate 1 is the same as or similar to the thermal expansion coefficient of the organic material. Here, the thermal expansion coefficient of the carrier plate similar to the thermal expansion coefficient of the organic material, means that at a temperature higher than the first temperature threshold or in a normal temperature environment, the degree of contraction of the carrier plate is similar to the degree of contraction of the organic material. Then, the carrier plate does not restrict the extension of the flexible substrate, thereby enabling the formed flexible substrate to be uniformly pre-stretched.

Specifically, the flexible substrate 2 may be formed by coating an organic material on the carrier plate 1. In addition, the thermal expansion coefficient of the carrier plate 1 may be set to be the same as or similar to the thermal expansion coefficient of the organic material, so that when the flexible substrate 2 is formed on the carrier plate, the carrier plate 1 does not restrict the extension of the flexible substrate 2, thereby enabling the formed flexible substrate 2 to be uniformly pre-stretched. In some embodiments, the organic material may be polyimide (PI)/silicone material/polymethyl methacrylate (PMMA)/polycarbonate (PC)/acrylonitrile-butadiene-styrene copolymer (ABS)/polyethylene/Polystyrene based material.

In the second method, a flexible film layer is provided, the flexible film layer is attached to the carrier plate 1 and the flexible film layer thermally expands at the temperature higher than a preset temperature, thereby forming the flexible substrate 2.

Specifically, a flexible film layer may be formed by using an organic material in a normal temperature environment. Then, the flexible film layer is attached to the carrier plate 1 through a glue material at a temperature higher than a preset temperature, so that the flexible film layer thermally expands at the temperature higher than the preset temperature, thereby forming a flexible substrate 2 having a uniform pre-stretching amount. It should be noted that the thermal expansion coefficient of the carrier plate 1 is the same as or similar to the thermal expansion coefficient of the flexible film layer, thereby preventing the carrier plate 1 from restricting the extension of the flexible film layer.

Further, there are various methods for forming the stress layer 3 on the flexible substrate 2. Two specific methods for forming the stress layer 3 are exemplified hereinafter.

In a first method, an inorganic material is deposited on the flexible substrate 2 to form an entire layer of the stress layer 3.

Specifically, the inorganic material may be deposited on the flexible substrate 2 by physical or chemical deposition to form an entire layer of the stress layer 3. It should be noted that the thermal expansion coefficient of the selected inorganic material is different from the thermal expansion coefficient of the flexible substrate 2, thereby generating stress between the stress layer 3 and the flexible substrate 2. In some embodiments, an inorganic material such as SiN or SiO may be deposited on the flexible substrate 2 by a chemical vapor deposition method, or an inorganic material such as such as aluminum/titanium/molybdenum/copper or other metal material may be deposited on the flexible substrate 2 by a sputtering method. In this way, the stress layer 3 is deposited on the flexible substrate 2 as an entire layer.

In the second method, an inorganic thin film layer is provided; the inorganic thin film layer is attached to the flexible substrate 2, and the inorganic thin film layer thermally expands at a temperature higher than a preset temperature, thereby forming an entire layer of stress layer 3.

Specifically, an inorganic thin film layer is first formed by using an inorganic material in a normal temperature environment. Then, the inorganic thin film layer is attached to the flexible substrate 2 through a glue material at a temperature higher than a preset temperature. The inorganic thin film layer thermally expands at the temperature higher than the preset temperature, thereby forming an entire layer of stress layer 3 which is uniformly stretched.

Figure 4:
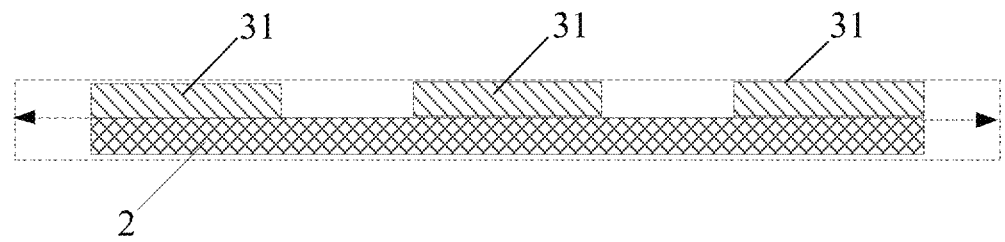
FIG. 4 is a third schematic structural view of a pre-stretched substrate according to an embodiment of the present disclosure.

Further, after forming the entire layer of the stress layer, the method for manufacturing the pre-stretched substrate provided in the above embodiment further includes: as shown in FIG. 4, patterning the entire layer of the stress layer 3 to form a plurality of separate stress layer graphics 31.

Specifically, after forming the entire layer of stress layer 3, the entire layer of stress layer 3 may also be patterned to form a plurality of separate stress layer graphics 31. When patterning the entire layer of stress layer 3, distribution of the stress layer graphics 31 may be set according to actual needs, so that the prepared pre-stretched substrate can achieve partial pre-stretching in different regions.

Further, there are various methods for forming the stress adjustment layer 4 on the surface of the flexible substrate 2 distal to the stress layer 3. Two specific methods for forming the stress adjustment layer 4 are exemplified hereinafter.

In the first method, the stress adjustment layer 4 is formed on the surface of the flexible substrate 2 distal to the stress layer 3 by using a metal material.

Specifically, the stress adjustment layer 4 may be formed by sputtering or evaporating an inorganic metal material such as Cu on the surface of the flexible substrate 2 distal to the stress layer 3. Position and size of the stress adjustment layer 4 may be set according to actual needs, thereby realizing stress adjustment of a designated area of the pre-stretched substrate by the stress adjustment layer 4, so that the adjusted pre-stretched substrate satisfies the pre-stretching requirement.

In the second method, an inorganic metal thin film layer is provided; the inorganic metal thin film layer is attached to the surface of the flexible substrate 2 distal to the stress layer 3, and the inorganic metal thin film layer thermally expands at a temperature higher than a preset temperature, thereby forming the stress adjustment layer 4.

Specifically, an inorganic metal thin film layer may be first formed by using an inorganic metal material in a normal temperature environment. Then, the inorganic metal thin film layer is attached to the surface of the flexible substrate 2 distal to the stress layer 3 through the glue material at a temperature higher than a preset temperature. The inorganic metal thin film layer thermally expands at a temperature higher than a preset temperature, thereby forming a uniformly stretched stress adjustment layer 4.

Further, the thermal expansion coefficient of the flexible substrate is between 10 ppm/° C. and 50000 ppm/° C.; and the thermal expansion coefficient of the stress layer is between 10 ppm/° C. and 1000 ppm/° C. When the thermal expansion coefficients of the flexible substrate 2 and the stress layer 3 are set to satisfy the above ranges, the flexible substrate 2 and the stress layer 3 can be uniformly extended at a temperature higher than the preset temperature, thereby ensuring flexibility of the prepared pre-stretched substrate. Besides, the pre-stretching amount of the prepared pre-stretched substrate is in a larger range, and then the prepared pre-stretched substrate can be widely used.

In some embodiments, the thermal expansion coefficient of the flexible substrate is between 3 ppm/° C. and 250 ppm/° C.; the thermal expansion coefficient of the stress layer is between 3 ppm/° C. and 100 ppm/° C.; and the thermal expansion coefficient of the stress adjustment layer is between 3 ppm/° C. to 100 ppm/° C.

One embodiment of the present disclosure further provides a pre-stretched substrate, which is manufactured according to the method for manufacturing pre-stretched substrates provided in the above embodiment. The pre-stretched substrate includes at least two film layers which are stacked on each other. The at least two film layers have different thermal expansion coefficients.

Specifically, since the pre-stretched substrate provided in the embodiment of the present disclosure is manufactured according to the method for manufacturing pre-stretched substrates provided in the above embodiment, stress is generated between film layers included in the pre-stretched substrate provided in the embodiment of the present disclosure, and then the pre-stretched substrate has uniform pre-stretching amount. Besides, the size of the manufactured pre-stretched substrate is not limited, and a large-area pre-stretched substrate can be manufactured. In addition, since the pre-stretched substrate provided in the embodiment of the present disclosure includes at least two film layers, the prepared pre-stretched substrate has better resistance to water and oxygen, thereby effectively extending the service life of the display device.

One embodiment of the present disclosure further provides a method for manufacturing an electronic device, including the method for manufacturing a pre-stretched substrate provided in the above embodiments. The method for manufacturing the electronic device includes the following steps.

S21: sequentially forming at least two film layers on a carrier plate at a temperature higher than a preset temperature, where thermal expansion coefficients of the at least two film layers are different.

Specifically, the above preset temperature may be a normal temperature, for example, 25° C. The temperature higher than the preset temperature may be set according to the thermal expansion coefficients of at least two film layers actually formed. For example, the temperature higher than the preset temperature may be set between 100° C. and 300° C. The at least two film layers formed at the temperature higher than the preset temperature can be uniformly extended. Besides, since the thermal expansion coefficients of the at least two film layers are different, the at least two film layers formed at the same temperature higher than the preset temperature have different expansion degrees. It should be noted that at least two film layers sequentially formed on the carrier plate are laminated.

S22: forming a driving circuit on one of the at least two film layers, which is farthest from the carrier plate.

Figure 5:
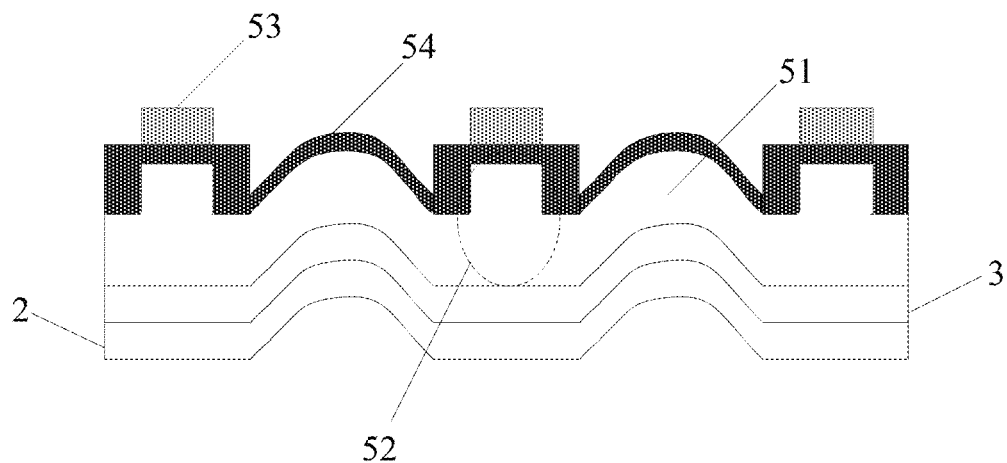
FIG. 5 is a schematic structural view of an electronic device according to an embodiment of the present disclosure, when the electronic device is not stretched.
Figure 6:
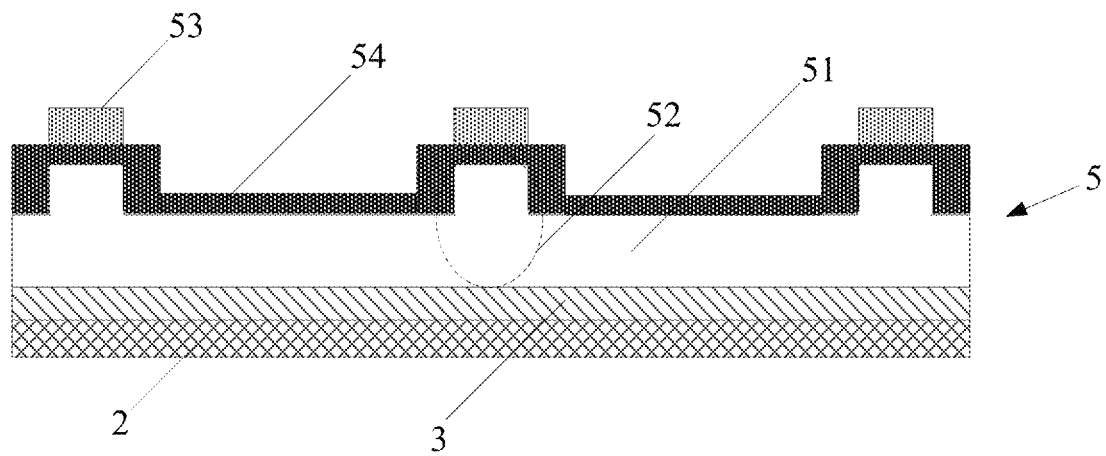
FIG. 6 is a schematic structural view of an electronic device according to an embodiment of the present disclosure, when the electronic device is stretched.

Specifically, as shown in FIG. 5 and FIG. 6, a driving circuit 5 formed on the uppermost film layer includes a second flexible substrate layer, components 53 and a wiring layer 54. The second flexible substrate layer includes thinner soft portions 51 and thicker rigid portions 52. The thinner soft portion 51 has good elasticity and is elastically deformable under tension. The components 53 for realizing driving functions are formed on the thicker rigid portions 52. The components 53 may be connected by the wiring layer 54. The thicker rigid portion 52 is less likely to be elastically deformed under tension, thereby better ensuring operation performance of the driving circuit 5.

In some embodiments, the driving circuit 5 and the at least two film layers may be separately manufactured, and then the driving circuit 5 and the at least two film layers are bonded together.

S23: separating the film layer in contact with the carrier plate from the carrier plate to obtain a pre-stretched electronic device. The pre-stretched electronic device includes at least two film layers, and the driving circuit on one of the at least two film layers, which is farthest from the carrier plate.

Specifically, after fabrication of the at least two film layers and the driving circuit 5 is completed at the temperature higher than the preset temperature, the film layer in contact with the carrier plate can be separated from the carrier plate, thereby obtaining the pre-stretched electronic device that is composed of the at least two film layers and the driving circuit 5 on one of the at least two film layers, which is farthest from the carrier plate. In the pre-stretched electronic device, since the thermal expansion coefficients of the at least two film layers are different, when the pre-stretched electronic device is placed in a normal temperature environment, film layers of the at least two film layers have different degrees of contraction. Then, stress is generated between the film layers, thereby enabling the pre-stretched electronic device to have pre-stretching properties. It should be noted that, after the formation of the driving circuit 5, in the normal temperature environment, the stretched state of the soft portion 51 in the driving circuit 5 synchronously changes in accordance with the stretched state of the pre-stretched substrate (including at least two film layers described above), as shown in FIG. 5.

Further, the step of sequentially forming at least two film layers on the carrier plate specifically includes: forming a first film layer on the carrier plate, and forming a second film layer on a surface of the first film layer distal to the carrier plate.

The step of forming a driving circuit on one of the at least two film layers, which is farthest from the carrier plate, specifically includes: forming the driving circuit on the second film layer.

The step of separating the film layer in contact with the carrier plate from the carrier plate to obtain a pre-stretched electronic device, specifically includes: separating the first film layer from the carrier plate with the pre-stretched electronic device including the first film layer, the second film layer on the first film layer, and the driving circuit on the second film layer.

Further, after the first film layer is separated from the carrier plate, the method for manufacturing the pre-stretched electronic device further includes: forming a third film layer on a surface of the first film layer distal to the second film layer at a temperature higher than a preset temperature, where a thermal expansion coefficient of the third film layer is different from the thermal expansion coefficient of the first film layer.

The first film layer, the second film layer, and the third film layer are various in kind. For example, the first film layer includes a flexible substrate, the second film layer includes a stress layer, and the third film layer includes a stress adjustment layer. Hereinafter, the manufacturing process of the electronic device is described in detail hereinafter with an example, in which the first film layer is a flexible substrate, the second film layer is a stress layer and the third film layer is a stress adjustment layer.

As shown in FIG. 1, the step of sequentially forming at least two film layers on a carrier plate 1, includes: forming a flexible substrate 2 on the carrier plate 1, and forming a stress layer 3 on a surface of the flexible substrate 2 distal to the carrier plate 1. The thermal expansion coefficient of the stress layer 3 is different from the thermal expansion coefficient of the flexible substrate 2.

Specifically, the temperature higher than the preset temperature may be set according to the thermal expansion coefficient of the flexible substrate 2 and the thermal expansion coefficient of the stress layer 3 to be actually manufactured. For example, the preset temperature may be set between 100° C. and 300° C. Since the preset temperature is higher than the normal temperature, the flexible substrate 2 and the stress layer 3 formed at the temperature higher than the preset temperature can be uniformly extended. Besides, since the thermal expansion coefficients of the flexible substrate 2 and the stress layer 3 are different, the flexible substrate 2 and the stress layer 3 formed at the same temperature higher than the preset temperature have different expansion degrees.

The step of forming a driving circuit on one of the at least two film layers, which is farthest from the carrier plate, specifically includes: forming the driving circuit 5 on the stress layer 3, as shown in FIG. 5 and FIG. 6.

The step of separating the film layer in contact with the carrier plate 1 from the carrier plate 1 to obtain a pre-stretched electronic device, specifically includes: separating the flexible substrate 2 from the carrier plate 1 with the pre-stretched electronic device including the flexible substrate 2, the stress layer 3 on the flexible substrate 2 and the driving circuit 5 on the stress layer 3.

Specifically, after fabrication of the flexible substrate 2, the stress layer 3 and the driving circuit 5, the flexible substrate 2 is separated from the carrier plate 1, thereby obtaining the pre-stretched electronic device which is composed of the flexible substrate 2, the stress layer 3 and the driving circuit 5. In the pre-stretched electronic device, since the thermal expansion coefficients of the flexible substrate 2 and the stress layer 3 are different, when the pre-stretched electronic device is applied in a normal temperature environment, the flexible substrate 2 and the stress layer 3 have different degrees of contraction. And then, stress is generated between the flexible substrate 2 and the stress layer 3, thereby enabling the pre-stretched electronic device to have pre-stretching properties. More specifically, in an example in which the thermal expansion coefficient of the stress layer 3 is less than the thermal expansion coefficient of the flexible substrate 2, since the thermal expansion coefficient of the stress layer 3 is less than the thermal expansion coefficient of the flexible substrate 2, the degree of thermal expansion of the stress layer 3 is less than the degree of thermal expansion of the flexible substrate 2 when manufacturing the flexible substrate 2 and the stress layer 3 at the temperature higher than the preset temperature. Correspondingly, when the prepared flexible substrate 2 and the stress layer 3 are placed in a normal temperature environment, the degree of contraction of the stress layer 3 is less than the degree of contraction of the flexible substrate 2. Then, stress is generated between the flexible substrate 2 and the stress layer 3, thereby enabling the pre-stretched substrate to have pre-stretching properties. After the driving circuit 5 is formed on the stress layer 3, in the normal temperature environment, the stretched state of the soft portion 51 in the driving circuit 5 synchronously changes in accordance with the stretched state of the pre-stretched substrate (including the flexible substrate 2 and the stress layer 3), as shown in FIG. 5.

According to the method for manufacturing electronic devices provided in the embodiment of the present disclosure, the flexible substrate 2 is first formed on the carrier plate 1 at the temperature higher than the preset temperature, so that the flexible substrate 2 can undergo uniform thermal expansion. Then, the stress layer 3 is formed on the flexible substrate 2. The thermal expansion coefficient of the formed stress layer 3 is different from that of the flexible substrate 2. And then, the driving circuit 5 is formed on the stress layer 3. Finally, the flexible substrate 2 is separated from the carrier plate 1, thereby forming the pre-stretched electronic device which is composed of the flexible substrate 2, the stress layer 3 and the driving circuit 5. Since the thermal expansion coefficients of the flexible substrate 2 and the stress layer 3 are different, when the pre-stretched substrate is applied in a normal temperature environment, the flexible substrate 2 and the stress layer 3 have different degrees of contraction. And then, stress is generated between the flexible substrate 2 and the stress layer 3, thereby forming the pre-stretched substrate. The driving circuit 5 formed on the pre-stretched substrate includes the soft portions 51 and the rigid portions 52. The stretched state of the soft portion 51 in the driving circuit 5 changes in accordance with the stretched state of the pre-stretched substrate, as shown in FIG. 5 and FIG. 6, thereby enabling the electronic device to have pre-stretching properties.

It can be seen that in the electronic device having pre-stretching properties, which is manufactured according to the method for manufacturing electronic devices provided in above embodiment of the present disclosure, the flexible substrate 2 and the stress layer 3 included in the pre-stretched substrate are uniformly thermally expanded at the temperature higher than the preset temperature, thereby ensuring uniformity of a pre-stretching amount of the pre-stretched substrate. Further, the size of the manufactured pre-stretched substrate is not limited, and a large-area pre-stretched substrate can be manufactured. Thus, after fabrication of the driving circuit 5 on the pre-stretched substrate, the prepared electronic device (including the flexible substrate 2, the stress layer 3 and the driving circuit 5) has a uniform pre-stretching amount. In this way, the electronic device has stronger stress tolerance in practical applications, and the tensile properties of the electronic device can be better improved.

In addition, since the prepared pre-stretched substrate includes the flexible substrate 2 and the stress layer 3, the prepared pre-stretched substrate has better resistance to water and oxygen. Thus, after fabrication of the driving circuit 5 on the pre-stretched substrate, the prepared electronic device has pre-stretching properties and better sealing performance, thereby effectively extending the service life of the electronic device.

Further, after the flexible substrate 2 is separated from the carrier plate 1, the method for manufacturing electronic devices provided in the above embodiment further includes:

forming a stress adjustment layer 4 on a surface of the flexible substrate 2 distal to the stress layer 3 at a temperature higher than a preset temperature. The thermal expansion coefficient of the stress adjustment layer 4 is different from the thermal expansion coefficient of the flexible substrate 2.

Specifically, after fabrication of the pre-stretched electronic device, the presence of the stress adjustment layer 4, which is formed on the surface of the flexible substrate 2 distal to the stress layer 3 and has a thermal expansion coefficient different from that of the flexible substrate 2, can further adjust the pre-stretching amount of the electronic device. More specifically, taking the stress adjustment layer 4 having a thermal expansion coefficient greater than that of the flexible substrate 2 as an example, when the formed electronic device is excessively pre-stretched and cannot meet actual requirements, the stress adjustment layer 4 having a thermal expansion coefficient greater than the thermal expansion coefficient of the flexible substrate 2 may be formed on the surface of the flexible substrate 2 distal to the stress layer 3. In this way, at the temperature higher than the preset temperature, the degree of expansion of the stress adjustment layer 4 is greater than the degree of expansion of the flexible substrate 2. Correspondingly, when the electronic device is applied in the normal temperature environment, the degree of contraction of the stress adjustment layer 4 is greater than the degree of contraction of the flexible substrate 2. Then, the stress adjustment layer 4 can change the stress between the flexible substrate 2 and the stress layer 3, thereby achieving adjustment of the pre-stretching amount of the electronic device.

Further, there are various methods for forming the stress layer 3 on the flexible substrate 2. Two specific methods are exemplified hereinafter, but are not limited thereto.

In a first method, an entire layer of the stress layer 3 is formed on the flexible substrate 2.

Specifically, when an entire layer of the stress layer 3 is formed on the flexible substrate 2, stress is generated between the flexible substrate 2 and the entire layer of the stress layer 3, so that the entire area of the formed electronic device has pre-stretching properties.

In the second method, a plurality of separate stress layer graphics is formed on the flexible substrate.

Specifically, when a plurality of separate stress layer graphics 31 is formed on the flexible substrate 2, distribution of the stress layer graphics 31 may be set according to actual needs, so that the prepared pre-stretched substrate can achieve partial pre-stretching in different regions.

One embodiment of the present disclosure further provides an electronic device which is manufactured according to the method for manufacturing electronic devices provided in the above embodiments.

Specifically, since the electronic device provided in the embodiment of the present disclosure is manufactured according to the method for manufacturing electronic devices provided in the above embodiment, stress is generated between the flexible substrate and the stress layer included in the electronic device provided in the embodiment of the present disclosure, and then the electronic device has uniform pre-stretching amount. Besides, the size of the electronic device is not limited, and a large-area electronic device can be manufactured. In addition, in the electronic device provided in the embodiment of the present disclosure, the pre-stretched substrate includes the flexible substrate and the stress layer, so that the pre-stretched substrate has better resistance to water and oxygen, thereby effectively extending the service life of the display device.

Unless otherwise defined, any technical or scientific terms used herein shall have the common meaning understood by a person of ordinary skills. Such words as "first" and "second" used in the specification are merely used to differentiate different components rather than to represent any order, number or importance. Such words as "comprise" or "comprising" means that an element or an object preceding the word includes an element or an object listed after the word and its equivalent, without excluding other elements or objects. Such words as "connect" or "connected to" may include electrical connection, direct or indirect, rather than being limited to physical or mechanical connection. Such words as "on/above", "under/below", "left" and "right" are merely used to represent relative position relationship, and when an absolute position of an object is changed, the relative position relationship will be changed too.

It should be understood that when an element such as a layer, a film, a region or a substrate is referred to as being "on" or "under" another element, the element may be "directly" "on" or "under" the another element, or there may be an intermediate component.

In the description of the above embodiments, specific features, structures, materials or characteristics may be combined in any suitable manner in any one or more embodiments or examples.

The above are merely the preferred embodiments of the present disclosure and shall not be used to limit the scope of the present disclosure. A person skilled in the art may make improvements and modifications without departing from the principle of the present disclosure, and these improvements and modifications shall also fall within the scope of the present disclosure. Therefore, the protection scope of the present disclosure should be determined by the scope of the appended claims.

What is claimed is:

1. A method for manufacturing a pre-stretched substrate, comprising:
sequentially forming at least two film layers on a carrier plate at a temperature higher than a first temperature threshold; wherein thermal expansion coefficients of the at least two film layers are different; and
separating the at least two film layers from the carrier plate, thereby obtaining the pre-stretched substrate; wherein the at least two film layers have different degrees of contraction in a normal temperature environment;
wherein the sequentially forming at least two film layers on a carrier plate, includes: forming a first film layer on the carrier plate, and forming a second film layer on a surface of the first film layer distal to the carrier plate;
the separating the at least two film layers from the carrier plate, thereby obtaining the pre-stretched substrate, includes:
separating the first film layer from the carrier plate with the pre-stretched substrate including the first film layer and the second film layer on the first film layer;
wherein after separating the at least two film layers from the carrier plate, the method further includes:
forming a third film layer on a surface of the first film layer distal to the second film layer at a temperature higher than a second temperature threshold; wherein a thermal expansion coefficient of the third film layer is different from the thermal expansion coefficient of the first film layer.

2. The method according to claim 1, wherein the first film layer includes a flexible substrate; the second film layer includes a stress layer; and the third film layer includes a stress adjustment layer.

3. The method according to claim 2, wherein the forming a first film layer on the carrier plate, includes:
forming the flexible substrate formed on the carrier plate by using an organic material; wherein a thermal expansion coefficient of the carrier plate is the same as or similar to a thermal expansion coefficient of the organic material; or,
providing a flexible film layer, attaching the flexible film layer to the carrier plate, and enabling the flexible film layer to thermally expand at the temperature higher than the first temperature threshold, thereby forming the flexible substrate.

4. The method according to claim 3, wherein the organic material is one of polyimide, silicone material, polymethyl methacrylate, polycarbonate, acrylonitrile-butadiene-styrene copolymer, polyethylene, and polystyrene.

5. The method according to claim 2, wherein the forming a second film layer on a surface of the first film layer distal to the carrier plate, includes:
   depositing an inorganic material on the flexible substrate to form an entire layer of the stress layer; or,
   providing an inorganic thin film layer, attaching the inorganic thin film layer to the flexible substrate, and enabling the inorganic thin film layer to thermally expand at the temperature higher than the first temperature threshold, thereby forming an entire layer of stress layer.

6. The method according to claim 5, wherein the inorganic material is SiN, SiO and metal.

7. The method according to claim 5, wherein after forming an entire layer of stress layer, the method further includes: patterning the entire layer of the stress layer to form a plurality of separate stress layer graphics.

8. The method according to claim 2, wherein the forming a second film layer on a surface of the first film layer distal to the carrier plate, includes:
   forming the stress adjustment layer on the surface of the flexible substrate distal to the stress layer by using a metal material; or,
   providing an inorganic metal thin film layer, attaching the inorganic metal thin film layer to the surface of the flexible substrate distal to the stress layer, and enabling the inorganic metal thin film layer to thermally expand at the temperature higher than the second temperature threshold, thereby forming the stress adjustment layer.

9. The method according to claim 2, wherein the thermal expansion coefficient of the flexible substrate is between 10 ppm/° C. and 50000 ppm/° C.; and the thermal expansion coefficient of the stress layer is between 10 ppm/° C. and 1000 ppm/° C.

10. The method according to claim 2, wherein the thermal expansion coefficient of the flexible substrate is between 3 ppm/° C. and 250 ppm/° C.; the thermal expansion coefficient of the stress layer is between 3 ppm/° C. and 100 ppm/° C.; and the thermal expansion coefficient of the stress adjustment layer is between 3 ppm/° C. to 100 ppm/° C.

11. A method for manufacturing an electronic device, comprising:
   sequentially forming at least two film layers on a carrier plate at a temperature higher than a first temperature threshold; wherein thermal expansion coefficients of the at least two film layers are different, and the at least two film layers have different degrees of contraction in a normal temperature environment;
   forming a driving circuit on one of the at least two film layers, which is farthest from the carrier plate; and
   separating one of the at least two film layers, which is in contact with the carrier plate, from the carrier plate to obtain a pre-stretched electronic device;
   wherein the pre-stretched electronic device includes the at least two film layers, and the driving circuit on one of the at least two film layers, which is farthest from the carrier plate.

12. The method according to claim 11, wherein the sequentially forming at least two film layers on a carrier plate, includes: forming a first film layer on the carrier plate, and forming a second film layer on a surface of the first film layer distal to the carrier plate;
   the forming a driving circuit on one of the at least two film layers, which is farthest from the carrier plate, includes: forming the driving circuit on the second film layer; and
   the separating one of the at least two film layers, which is in contact with the carrier plate, from the carrier plate to obtain a pre-stretched electronic device, includes: separating the first film layer from the carrier plate with the pre-stretched electronic device including the first film layer, the second film layer on the first film layer, and the driving circuit on the second film layer.

13. The method according to claim 12, wherein after separating the first film layer from the carrier plate, the method further includes:
   forming a third film layer on a surface of the first film layer distal to the second film layer at a temperature higher than a second temperature threshold; wherein a thermal expansion coefficient of the third film layer is different from the thermal expansion coefficient of the first film layer.

14. The method according to claim 13, wherein the first film layer includes a flexible substrate; the second film layer includes a stress layer; and the third film layer includes a stress adjustment layer.

15. The method according to claim 14, wherein the stress layer is formed on the flexible substrate in a way including:
   forming an entire layer of the stress layer on the flexible substrate; or,
   forming a plurality of separate stress layer graphics on the flexible substrate.

16. The method according to claim 11, wherein the forming a driving circuit on one of the at least two film layers, which is farthest from the carrier plate, includes: attaching the driving circuit to the at least two film layers;
   wherein the driving circuit includes a second flexible substrate layer attaching to the pre-stretched substrate, components for realizing driving functions and a wiring layer; the second flexible substrate layer includes thinner soft portions and thicker rigid portions; the components are on the thicker rigid portions and the components are connected by the wiring layer.

* * * * *